US009373973B2

(12) United States Patent
Lee

(10) Patent No.: US 9,373,973 B2
(45) Date of Patent: Jun. 21, 2016

(54) APPARATUS, SYSTEM, AND METHOD OF PREVENTING BATTERY RACK DAMAGE BY MEASURING CURRENT

(71) Applicant: LG CHEM, LTD., Seoul (KR)

(72) Inventor: Jongbum Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/649,323

(22) PCT Filed: Nov. 12, 2014

(86) PCT No.: PCT/KR2014/010872
§ 371 (c)(1),
(2) Date: Jun. 3, 2015

(87) PCT Pub. No.: WO2015/126036
PCT Pub. Date: Aug. 27, 2015

(65) Prior Publication Data
US 2016/0020629 A1    Jan. 21, 2016

(30) Foreign Application Priority Data

Feb. 20, 2014  (KR) .................. 10-2014-0019880
Nov. 12, 2014  (KR) .................. 10-2014-0156966

(51) Int. Cl.
*H02J 7/24* (2006.01)
*H02J 9/00* (2006.01)
(Continued)

(52) U.S. Cl.
CPC ........... *H02J 7/0083* (2013.01); *G01R 31/3624* (2013.01); *G01R 31/3648* (2013.01); *H01M 10/482* (2013.01); *H02H 7/18* (2013.01); *H02J 7/0021* (2013.01); *H02J 7/0026* (2013.01)

(58) Field of Classification Search
CPC ..... H02J 7/0008; H02J 7/0022; H02J 7/0031; H02J 7/0068; H02J 7/0072; H02J 3/00; H01F 29/02; H01F 27/06; H01F 38/18; H02M 2001/009
USPC ............................................ 320/164; 307/77
See application file for complete search history.

(56) References Cited
U.S. PATENT DOCUMENTS 6,239,579 B1 *   5/2001   Dunn ................. G01R 31/3658
                                                              320/119
2011/0080139 A1   4/2011   Troxel et al.
(Continued)

FOREIGN PATENT DOCUMENTS

JP    2007-37373 A    2/2007
JP    2011-004585 A   1/2011
(Continued)

OTHER PUBLICATIONS

Written Opinion issued in PCT/KR2014/010872, mailed on Mar. 13, 2015.
(Continued)

*Primary Examiner* — Richard Isla Rodas
*Assistant Examiner* — Mohammed J Sharief
(74) *Attorney, Agent, or Firm* — Birch, Stewart, Kolasch & Birch, LLP

(57) ABSTRACT

The present invention relates to an apparatus, a system, and a method of preventing a battery rack from being damaged by measuring a current, which, when a battery module is abnormally connected with a relay in some battery racks in installing the relay, which conducts or blocks a current flowing in the battery rack including a plurality of battery modules so that a current exceeding a predetermined current limit value flows in the battery rack, prevent a short-circuit phenomenon, by controlling an operation state of the relay before the battery rack and the relay form a short circuit, and prevent capacitance imbalance between the battery racks by controlling an operation state of the relay when a voltage difference between a plurality of battery racks exceeds a predetermined voltage difference.

24 Claims, 8 Drawing Sheets

(51) Int. Cl.
*H02J 7/00* (2006.01)
*H01M 10/48* (2006.01)
*H02H 7/18* (2006.01)
*G01R 31/36* (2006.01)

(56) References Cited

U.S. PATENT DOCUMENTS

| | | |
|---|---|---|
| 2012/0007547 A1 | 1/2012 | Kim |
| 2012/0046893 A1 | 2/2012 | Kaneko et al. |
| 2012/0274142 A1* | 11/2012 | Tinglow ............... H02J 7/0026 307/77 |
| 2013/0009648 A1 | 1/2013 | Tae |
| 2013/0033794 A1 | 2/2013 | Baek |

FOREIGN PATENT DOCUMENTS

| | | |
|---|---|---|
| JP | 2013-017323 A | 1/2013 |
| KR | 10-2008-0037941 A | 5/2008 |
| KR | 10-2012-0005368 A | 1/2012 |
| KR | 10-2013-0016652 A | 2/2013 |
| WO | WO 2013/005440 A2 | 1/2013 |

OTHER PUBLICATIONS

Korean Office Action dated Feb. 5, 2016 for Application No. 10-2014-0156966.

* cited by examiner

APPARATUS, SYSTEM, AND METHOD OF PREVENTING BATTERY RACK DAMAGE BY MEASURING CURRENT

TECHNICAL FIELD

This application claims priority to and the benefit of Korean Patent Application No. 10-2014-0019880 filed in the Korean Intellectual Property Office on Feb. 20, 2014, and Korean Patent Application No. 10-2014-0156966 filed in the Korean Intellectual Property Office on Nov. 12, 2014, the entire contents of which are incorporated herein by reference.

The present invention relates to an apparatus, a system, and a method of preventing a battery rack from being damaged by measuring a current, and more particularly, an apparatus, a system, and a method of preventing a battery rack from being damaged by measuring a current, which, when a battery module is abnormally connected with a relay in some battery racks in installing the relay, which conducts or blocks a current flowing in the battery rack including a plurality of battery modules, so that a current exceeding a predetermined current limit value flows in the battery rack, prevent a short-circuit phenomenon that occurs in the battery rack in which the relay is abnormally installed, by controlling an operation state of the relay before the battery rack and the relay form a short circuit, and prevent capacitance imbalance between the battery racks by controlling an operation state of the relay when a voltage difference between a plurality of battery racks exceeds a predetermined voltage difference, thereby preventing the battery rack, a battery protection unit (BPU), and an electronic component from being damaged.

BACKGROUND ART

Recently, interest in an electric product, which can be driven by using a rechargeable battery, has increased due to depletion of fossil energy, and environmental pollution due to use of fossil energy. Accordingly, in view of technical development and demands for a mobile device, an electric vehicle (EV), a hybrid vehicle (HV), an energy storage system (ESS), and an uninterruptible power supply (UPS) have increased, demands for a rechargeable battery as an energy source have been rapidly increased.

The rechargeable battery attracts attention as a new energy source that is environmentally-friendly and with improved energy efficiency in that it is possible to innovatively decrease use of fossil energy, which is the primary advantage, while not generating a by-product when using energy.

Particularly, a rechargeable battery used in an EV, an HV, an ESS, and a UPS is configured by connecting a plurality of battery racks including a plurality of battery modules in order to charge or discharge high-output and large capacitance power. A relay control technique for controlling a current flowing in the battery rack by installing a relay is provided in the battery rack, in which high-output and large capacitance power is frequently charged or discharged, in order to protect the battery rack from overcharging, overdischarging, and a surge current.

However, when the relay installed by an installer for protecting the battery rack is abnormally installed to configure a closed circuit, in which only the relay and the battery rack are connected, without an external load, a short-circuit phenomenon occurs in the battery rack. When the short-circuit phenomenon occurs in some battery racks among the plurality of battery racks connected to secure high capacitance, a charging speed of each battery rack varies due to capacitance imbalance between the battery racks, and thus the first charged battery rack is overcharged, so that there is a problem in that the battery rack is damaged due to overheating or swelling, and as a result, the BPU and the electronic component connected with the battery rack are damaged.

In this respect, the present inventors completed an apparatus, a system, and a method of preventing a battery rack from being damaged by measuring a current, which, when a battery module is abnormally connected with a relay in some battery racks in installing the relay, which conducts or blocks a current flowing in the battery rack including a plurality of battery modules, so that a current exceeding a predetermined current limit value flows in the battery rack, prevent a short-circuit phenomenon that occurs in the battery rack in which the relay is abnormally installed, by controlling an operation state of the relay before the battery rack and the relay form a short circuit, and prevent capacitance imbalance between the battery racks by controlling an operation state of the relay when a voltage difference between a plurality of battery racks exceeds a predetermined voltage difference, thereby preventing the battery rack, a BPU, and an electronic component from being damaged.

DETAILED DESCRIPTION OF THE INVENTION

Technical Problem

The present invention relates to an apparatus, a system, and a method of preventing a battery rack from being damaged by measuring a current, and more particularly, provides an apparatus, a system, and a method of preventing a battery rack from being damaged by measuring a current, which, when a battery module is abnormally connected with a relay in some battery racks so that a current exceeding a predetermined current limit value flows in the battery rack while installing the relay, which conducts or blocks a current flowing in the battery rack including a plurality of battery modules, prevent a short-circuit phenomenon that occurs in the battery rack in which the relay is abnormally installed, by controlling an operation state of the relay before the battery rack and the relay form a short circuit, and prevent capacitance imbalance between the battery racks by controlling an operation state of the relay when a voltage difference between a plurality of battery racks exceeds a predetermined voltage difference, thereby preventing the battery rack, a battery protection unit (BPU), and an electronic component from being damaged.

More particularly, an object of the present invention is to provide an apparatus, a system, and a method of preventing a battery rack from being damaged by measuring a current, which, when an installer abnormally installs a relay, so that a closed circuit, in which only a relay and a battery rack are connected without an external load, is configured, measure a current flowing in the battery rack by a current measuring unit and to detect a short-circuit phenomenon that occurs in the battery rack, determine that the short-circuit phenomenon occurs in the battery rack when a value of the measured current exceeds a predetermined current limit value, and control a precharge relay and a main relay by a relay controller to block the current flowing in the battery rack, thereby preventing the battery rack, a BPU, and an electronic component from being damaged due to the short-circuit phenomenon.

Another object of the present invention is to provide an apparatus, a system, and a method of preventing a battery rack from being damaged by measuring a current, which calculate a voltage difference between a plurality of battery racks by a voltage comparing unit, and control a precharge relay and a main relay by a relay controller when the calculated voltage difference exceeds a predetermined voltage allowance value, thereby preventing the battery rack, a BPU, and an electronic component from being damaged due to capacitance imbalance between the battery racks.

Yet another object of the present invention is to provide an apparatus, a system, and a method of preventing a battery rack from being damaged by measuring a current, in which an apparatus for preventing a battery rack from being damaged by measuring a current is provided in one or more battery racks each in an energy storage device or a battery system that is connected with one or more battery racks and charges/discharges power, and which may individually perform a process of, on a corresponding battery rack, measuring a current value of a corresponding battery rack and comparing the measured current value with a predetermined current limit value, and controlling operation states of a precharge relay and a main relay of the corresponding battery rack according to a result of the comparison.

Technical Solution

An apparatus for preventing a battery rack from being damaged by measuring a current according to an exemplary embodiment of the present invention includes: a current measuring unit configured to measure a current value of a battery rack including a plurality of battery modules; a current comparing unit configured to compare whether the current value measured by the current measuring unit is greater or smaller than a predetermined current limit value; a relay controller configured to control operation states of a precharge relay and a main relay based on the comparison result value obtained by the current comparing unit before the operation state of the main relay is changed from an off state to an on state after the operation state of the precharge relay is changed to the on state; and a voltage measuring unit configured to measure a voltage value of the battery rack, in which the apparatus for preventing a battery rack from being damaged by measuring a current is provided in one or more battery racks each, and individually performs, on a corresponding battery rack, a process of measuring a current value of the corresponding battery rack, comparing the measured current value with a predetermined current limit value, and controlling operation states of a precharge relay and a main relay of the corresponding battery rack according to a result of the comparison, and a process of measuring a voltage value of the corresponding battery rack.

In the exemplary embodiment, the precharge relay may be serially connected with a precharge resistor, of which a resistance value is determined according to a capacity of the battery rack, to decrease a current value of an overcurrent flowing in the battery rack.

In the exemplary embodiment, the current measuring unit may measure a current value of a current flowing in the battery rack and transmit the measured current value to the current comparing unit, and include a current sensor corresponding to one or more of a current transformer method, a hall element method, and a fuse method.

In the exemplary embodiment, when the current value received from the current measuring unit exceeds the predetermined current limit value, the current comparing unit may transmit a current exceeding signal to the relay controller.

In the exemplary embodiment, when the relay controller receives the current exceeding signal from the current comparing unit, the relay controller may change the operation state of the precharge relay from the on state to the off state, and maintain the operation state of the main relay in the off state.

In the exemplary embodiment, the apparatus may further include a voltage comparing unit connected with the voltage measuring unit, which measures a voltage of a plurality of battery racks each, and configured to calculate a difference between the plurality of voltage values measured by the voltage measuring unit.

In the exemplary embodiment, when the result value exceeding a predetermined voltage allowance difference is calculated among the result values obtained by calculating the difference between the plurality of voltage values, the voltage comparing unit may transmit a voltage imbalance signal to the relay controller.

In the exemplary embodiment, when the relay controller receives the voltage imbalance signal from the voltage comparing unit, the relay controller may change the operation states of the precharge relay and the main relay from the on state to the off state.

In the exemplary embodiment, the apparatus may be included in a battery management system for controlling the one or more battery racks.

A system for preventing a battery rack from being damaged by measuring a current according to another exemplary embodiment of the present invention includes an apparatus for preventing a battery rack from being damaged by measuring a current in one or more battery racks each, the apparatus including: a current measuring unit configured to measure a current value of a battery rack including a plurality of battery modules; a current comparing unit configured to compare whether the current value measured by the current measuring unit is greater or smaller than a predetermined current limit value; a relay controller configured to control operation states of a precharge relay and a main relay based on the comparison result value obtained by the current comparing unit before the operation state of the main relay is changed from an off state to an on state after the operation state of the precharge relay is changed to the on state; and a voltage measuring unit configured to measure a voltage value of the battery rack, in which the system for preventing a battery rack from being damaged by measuring a current individually performs, on a corresponding battery rack, a process of measuring a current value of the corresponding battery rack, comparing the measured current value with a predetermined current limit value, and controlling operation states of a precharge relay and a main relay of the corresponding battery rack according to a result of the comparison, and a process of measuring a voltage value of the corresponding battery rack.

In the exemplary embodiment, the precharge relay may be serially connected with a precharge resistor, of which a resistance value is determined according to a capacity of the battery rack, to decrease a current value of an overcurrent flowing in the battery rack.

In the exemplary embodiment, the current measuring unit may measure a current value of a current flowing in the battery rack and transmit the measured current value to the current comparing unit, and include a current sensor corresponding to one or more of a current transformer method, a hall element method, and a fuse method.

In the exemplary embodiment, when the current value received from the current measuring unit exceeds the predetermined current limit value, the current comparing unit may transmit a current exceeding signal to the relay controller.

In the exemplary embodiment, when the relay controller receives the current exceeding signal from the current comparing unit, the relay controller may change the operation state of the precharge relay from the on state to the off state, and maintains the operation state of the main relay in the off state.

In the exemplary embodiment, the system may further include a voltage comparing unit connected with the voltage measuring unit, which measures a voltage of a plurality of battery racks each, and configured to calculate a difference between the plurality of voltage values measured by the voltage measuring unit.

In the exemplary embodiment, when the result value exceeding a predetermined voltage allowance difference is calculated among the result values obtained by calculating the difference between the plurality of voltage values, the voltage comparing unit may transmit a voltage imbalance signal to the relay controller.

In the exemplary embodiment, when the relay controller receives the voltage imbalance signal from the voltage comparing unit, the relay controller may change the operation states of the precharge relay and the main relay from the on state to the off state.

In the exemplary embodiment, the system may be included in a battery management system for controlling the one or more battery racks.

A method of preventing a battery rack from being damaged by measuring a current according to yet exemplary embodiment of the present invention includes: (a) providing an apparatus for preventing a battery rack from being damaged by measuring a current, which includes a current measuring unit, a current comparing unit, a relay controller, and a voltage measuring unit, in one or more battery racks each; (b) individually performing, by the apparatus, on a corresponding battery rack, a process of measuring a current value of the corresponding battery rack, comparing the measured current value with a predetermined current limit value, and controlling operation states of a precharge relay and a main relay of the corresponding battery rack according to a result of the comparison, and a process of measuring a voltage value of the corresponding battery rack; (c) providing a voltage comparing unit connected with the voltage measuring unit for measuring a voltage of the plurality of battery racks each; and (d) receiving a voltage value of the plurality of battery racks, calculating a difference between the plurality of voltage values, and controlling operation states of a precharge relay and a main relay of a corresponding battery rack according to a result of the calculation, in which (b) includes: (b1) measuring, by the current measuring unit, a current value of a battery rack including a plurality of battery modules; (b2) comparing, by the current comparing unit, whether the current value measured by the current measuring unit is greater or smaller than a predetermined current limit value; (b3) controlling, by the relay controller, the operation states of the precharge relay and the main relay based on the comparison result value obtained by the current comparing unit before the operation state of the main relay is changed from an off state to an on state after the operation state of the precharge relay is changed to the on state; and (b4) measuring, by the voltage measuring unit, a voltage value of the battery rack.

In the exemplary embodiment, (b1) may include measuring, by the current measuring unit, a current value of a current flowing in the battery rack and transmitting the measured current value to the current comparing unit In the exemplary embodiment, (b2) may include, when the current value received from the current measuring unit exceeds the predetermined current limit value, transmitting, by the current comparing unit, a current exceeding signal to the relay controller.

In the exemplary embodiment, (b3) may include, when the relay controller receives the current exceeding signal from the current comparing unit, changing, by the relay controller, the operation state of the precharge relay from the on state to the off state, and maintaining the operation state of the main relay in the off state.

In the exemplary embodiment, (d) may include calculating, by the voltage comparing unit, a difference between a plurality of voltage values measured by the voltage measuring unit, and transmitting a voltage imbalance signal to the relay controller when the result value exceeding a predetermined voltage allowance difference is calculated among the result values obtained by calculating the difference between the plurality of voltage values.

In the exemplary embodiment, (d) may further include changing, by the relay controller, the operation states of the precharge relay and the main relay from the on state to the off state when the relay controller receives the voltage imbalance signal from the voltage comparing unit.

Advantageous Effects

The apparatus, the system, and the method of preventing a battery rack from being damaged by measuring a current according to the exemplary embodiments of the present invention control operation states of the precharge relay and the main relay before a short-circuit phenomenon occurs in the battery rack when a measured current value of the battery rack exceeds a predetermined current limit value, thereby blocking a current flowing in the battery rack. Accordingly, there is an effect of preventing a battery rack from being damaged and fire due to overcharging and overheating by preventing a short-circuit phenomenon that occurs in a battery rack.

Further, the apparatus, the system, and the method of preventing a battery rack from being damaged by measuring a current according to the exemplary embodiments of the present invention control operation states of the precharge relay and the main relay when a voltage difference between the battery racks exceeds a predetermined voltage allowance difference, thereby achieving an effect of preventing capacitance imbalance between the battery racks.

Further, the present invention provides the apparatus for preventing a battery rack from being damaged by measuring a current in one or more battery racks each in an energy storage device or a battery system that is connected with one or more battery racks and charges/discharges power, and individually performs a process of, on a corresponding battery rack, measuring a current value of a corresponding battery rack and comparing the measured current value with a predetermined current limit value, and controlling operation states of a precharge relay and a main relay of the corresponding rack according to a result of the comparison, thereby achieving an effect of preventing charging capacitance imbalance between the battery racks due to a short-circuit phenomenon in some battery racks.

BEST MODE

The present invention will be described below with reference to the accompanying drawings. Herein, the detailed description of a known function and configuration that may make the purpose of the present invention unnecessarily ambiguous in describing the spirit of the present invention will be omitted. Exemplary embodiments of the present invention are provided so that those skilled in the art may more completely understand the present invention. Accordingly, the shape, the size, etc., of elements in the figures may be exaggerated for explicit comprehension.

Throughout the specification and the claims, unless explicitly described to the contrary, the word "comprise" and variations such as "comprises" or "comprising" will be understood to imply the inclusion of stated elements but not the exclusion of any other elements.

In addition, the term " . . . unit" described in the specification means a unit for processing at least one function and operation and may be implemented by hardware components or software components and combinations thereof.

Figure 1:
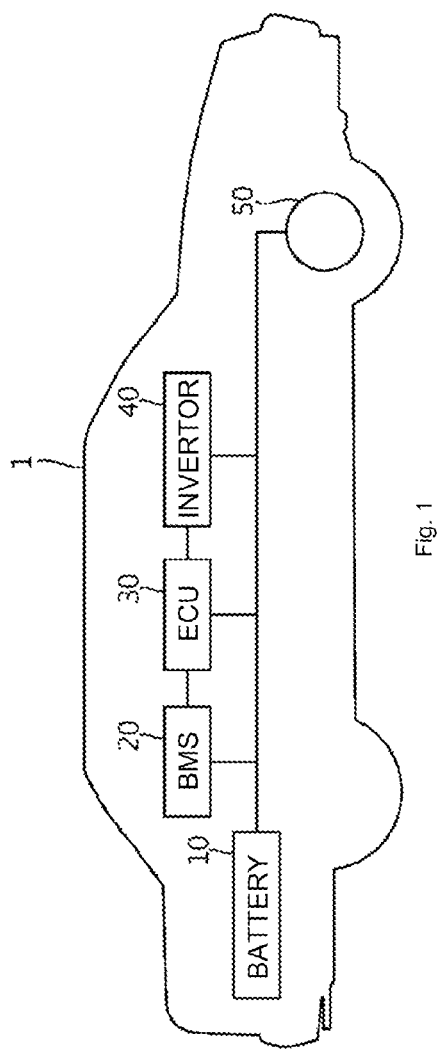
FIG. 1 is a diagram schematically illustrating an electric vehicle to which an apparatus for preventing a battery rack from being damaged by measuring a current according to an exemplary embodiment of the present invention is applicable.

FIG. 1 is a diagram schematically illustrating an electric vehicle to which an apparatus for preventing a battery rack from being damaged by measuring a current according to an exemplary embodiment of the present invention is applicable.

FIG. 1 illustrates an example in which an apparatus for preventing a battery rack from being damaged by measuring a current according to an exemplary embodiment of the present invention is applied to an electric vehicle, but as long as a rechargeable battery is applicable to a technical field, such as a mobile device, an energy storage system (ESS), or an uninterruptible power supply (UPS), in addition to an electric vehicle, an apparatus for preventing a battery rack from being damaged by measuring a current according to an exemplary embodiment of the present invention is applicable to any technical field.

An electric vehicle 1 may include a battery 10, a battery management system (BMS) 20, an electronic control unit (ECU) 30, an inverter 40, and a motor 50.

The battery 10 is an electric energy source for driving the electric vehicle 1 by providing driving force to the motor 50. The battery 10 may be charged or discharged by the inverter 40 according to driving of the motor 50 or an internal combustion engine (not illustrated).

Here, the kind of battery 10 is not particularly limited, and examples of the battery 10 may include a lithium ion battery, a lithium polymer battery, a nickel cadmium battery, a nickel hydrogen battery, a nickel zinc battery, and the like.

The BMS 20 estimates a state of the battery 10, and manages the battery 10 by using information on the estimated state. For example, the BMS 20 estimates and manages state information about the battery 10, such as a state of charging (SOC), a state of health (SOH), the amount of maximum input/output allowance power, and an output voltage. Further, charging or discharging of the battery 10 may be controlled by using the state information, and further, a replacement time of the battery 10 may be estimated.

Further, the BMS 20 may include an apparatus and system for preventing a battery rack from being damaged by measuring a current which will be described below. It is possible to prevent the battery 10 from being damaged due to overheating caused by overcharging of the battery 10 or occurrence of a short-circuit phenomenon by the apparatus and system for preventing a battery rack from being damaged by measuring a current.

The ECU 30 is an electronic control device for controlling a state of the electric vehicle 1. For example, the ECU 30 determines a torque degree based on information about an accelerator, a brake, a speed, and the like, and controls the state of the electric vehicle 1 so that an output of the motor 50 corresponds to torque information.

Further, the ECU 30 transmits a control signal to the inverter 40 so that the battery 10 is charged or discharged based on the state information, such as an SOC and an SOH, of the battery 10 received from the BMS 20.

The inverter 40 makes the battery 10 be charged or discharged based on the control signal of the ECU 30.

The motor 50 drives the electric vehicle 1 based on control information (for example, the torque information) transmitted from the ECU 30 by using electric energy of the battery 10.

Figure 2:
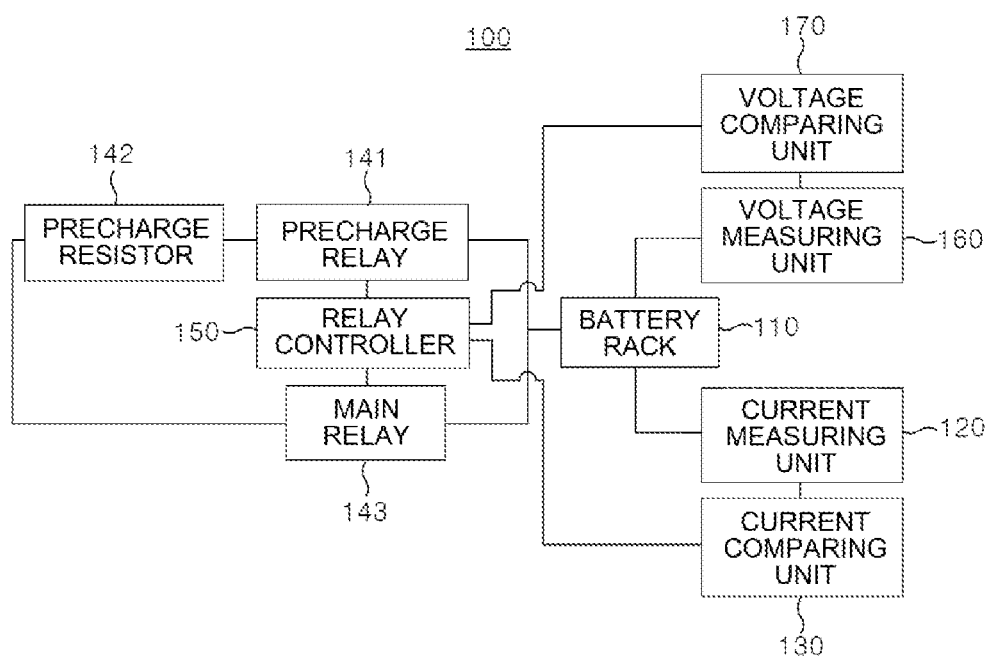
FIG. 2 is a block diagram illustrating a configuration of the apparatus for preventing a battery rack from being damaged by measuring a current according to an exemplary embodiment of the present invention.
Figure 3:
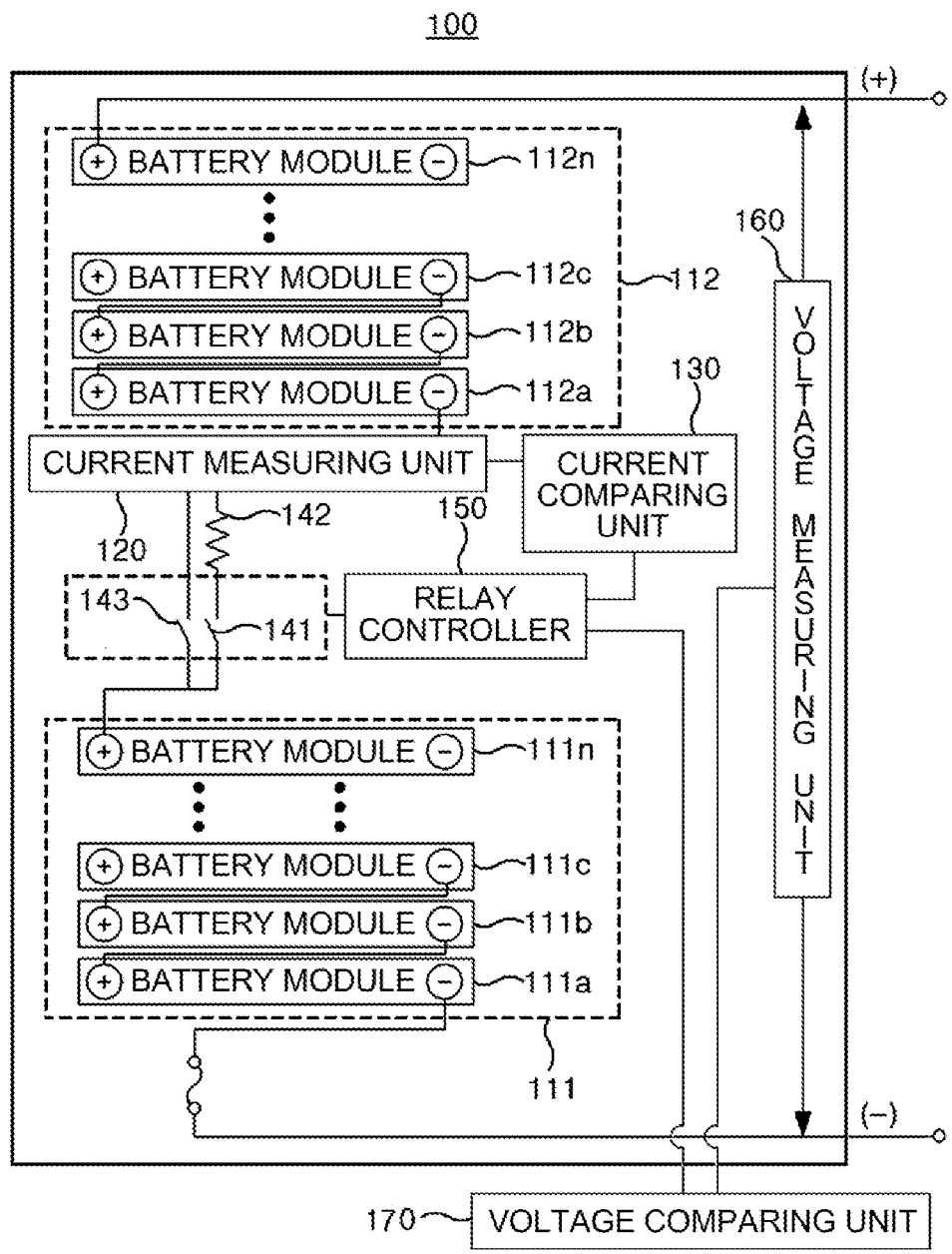
FIG. 3 is a diagram illustrating an example of a particular configuration of the apparatus for preventing a battery rack from being damaged by measuring a current according to an exemplary embodiment of the present invention.

FIG. 2 is a block diagram illustrating a configuration of an apparatus for preventing a battery rack from being damaged by measuring a current according to an exemplary embodiment of the present invention, and FIG. 3 is a diagram illustrating an example of a particular configuration of the apparatus for preventing a battery rack from being damaged by measuring a current according to an exemplary embodiment of the present invention.

Referring to FIGS. 2 and 3, an apparatus 100 for preventing a battery rack from being damaged by measuring a current includes a battery rack 110, a first battery rack 111, a second battery rack 112, a current measuring unit 120, a current comparing unit 130, a precharge relay 141, a precharge resistor 142, a main relay 143, a relay controller 150, a voltage measuring unit 160, and a voltage comparing unit 170. The apparatus 100 for preventing a battery rack from being damaged by measuring a current, which is illustrated in FIGS. 2 and 3, is an exemplary embodiment, and constituent elements thereof are not limited to the exemplary embodiment illustrated in FIGS. 2 and 3, and may be added, changed, or removed as necessary.

The battery rack 110 may be charged by receiving power, or discharged by supplying electric energy charged in the battery rack 110 to a load. Here, the kind of battery rack 110 is not particularly limited, and may include a plurality of battery modules.

In one exemplary embodiment, the battery rack 110 may be included in the battery 10 illustrated in FIG. 1, and since the battery rack 110 may use a publicly known related art, a detailed description thereof will be omitted.

In the meantime, the first battery rack 111 and the second battery rack 112 illustrated in FIG. 3 may be included in the battery rack 110, and the battery modules 111*a*, 111*b*, . . . , and 111*n*, which are connected at a lower side based on the precharge relay 141, the precharge resistor 142, and the main relay 143 that are connected for preventing the battery rack 110 from being damaged, may be the constituent elements of the first battery rack 111, and the battery modules 112*a*, 112*b*, . . . , and 112*n*, which are connected at an upper side may be the constituent elements of the second battery rack 112. In this case, the current measuring unit 120, which will be described below, may be serially connected between the first battery rack 111 and the second battery rack 112, to measure a current value.

The current measuring unit 120 may be serially connected between the first battery rack 111 and the second battery rack 112, and serve to measure a current value of a current flowing between the first battery rack 111 and the second battery rack 112.

The current measuring unit 120 performing the aforementioned function may use a current sensor corresponding to one or more among a current transformer method, a hall element method, and a fuse method in order to measure a current flowing in the battery rack 110, and may include one or more switch elements, capacitors, conductive lines, and the like.

Further, when a current measured by the relay 110 corresponds to a high current, the current measuring unit 120 may further include a stabilizer (not illustrated, for example, a resistor having a high resistance value) for autonomously protecting an inner part thereof.

The current value measured by the current measuring unit 120 may be transmitted to the current comparing unit 130, which will be described below, and it is noted that as long as the current measuring unit 120 performs the aforementioned function, the kind of current sensor of the current measuring unit 120 is not limited.

The current comparing unit 130 may serve to receive the measured current value from the current measuring unit 120, and compare the received current value with a predetermined current limit value.

Here, a current value of a current flowing in the battery rack 110, in which the battery rack 110 is normally connected with the precharge relay 141, the precharge resistor 142, and the main relay 143, which will be described below, so that a short circuit is not incurred, may be initially set as the predetermined current limit value, or the predetermined current limit value may be a value settable by a user. For example, the predetermined current limit value may be 50 A.

Next, when the measured current value exceeds the predetermined current limit value, the current comparing unit 130 may transmit a current exceeding signal to the relay controller 150, which will be described below, and when the measured current value does not exceed the predetermined current limit value, the current comparing unit 130 may not transmit the current exceeding signal.

In one exemplary embodiment, the current comparing unit 130 may further include a separate stabilizer (not illustrated, for example, a resistor having a high resistance value) similar to the current measuring unit 120, and thus may be configured to autonomously protect an inner part thereof from a high voltage.

The precharge relay 141 and the precharge resistor 142 may be serially connected, and the main relay 143 may be connected in parallel with the precharge relay 141 and the precharge resistor 142, which are serially connected, and serve to conduct or block the current flowing in the battery rack 110. Operation states of the precharge relay 141 and the main relay 143 may correspond to any one of an on state, in which a pair of conductive lines is in contact with each other, and an off state, in which a pair of conductive lines is spaced apart from each other, and when an operation state of any one or more of the precharge relay 141 and the main relay 143 corresponds to the on state, the current flowing in the battery rack 110 is conducted, and when all of the operation states of the precharge relay 141 and the main relay 143 correspond to the off state, the current flowing in the battery rack 110 may be blocked.

In the meantime, in order to protect the battery rack 110 from a surge current at an initial stage where power is supplied to the battery rack 110, the operation state of the precharge relay 141 may be changed to the on state, and when the operation state of the precharge relay 141 is changed to the on state, the surge current flows to the precharge resistor 142 serially connected with the precharge relay 141, thereby protecting the battery rack 110. After the operation state of the precharge relay 141 is changed to the on state, the operation state of the main relay 143 may be changed to the on state after a predetermined time (for example, a time corresponding to 1 s), and the current comparing unit 130 may serve to compare and determine the current value measured by the current measuring unit 120 with the predetermined current limit value from the change of the operation state of the precharge relay 141 to the on state until the operation state of the main relay 143 is changed to the on state.

Here, a current value of a current flowing in the battery rack 110, in which the battery rack 110 is normally connected with the precharge relay 141, the precharge resistor 142, and the main relay 143, so that a short circuit is not incurred, may be initially set as the predetermined current limit value, or the predetermined current limit value may be a value settable by a user. For example, the predetermined current limit value may be 50 A.

The operation state of the precharge relay 141 is changed to the off state after a predetermined time (for example, a time corresponding to 1 s) after the operation states of the precharge relay 141 and the main relay 143 are changed to the on state, so that power supplied to the battery rack 110 may be supplied without passing by the precharge resistor 142.

The relay controller 150 may be connected with the current comparing unit 130, the precharge relay 141, the precharge resistor 142, and the main relay 143, and when the relay controller 150 receives the current exceeding signal by the current comparing unit 130, the relay controller 150 may serve to change the operation state of the precharge relay 141 from the on state to the off state, and maintain the operation state of the main relay 143 in the off state. When the operation states of the precharge relay 141 and the main relay 143 are the off state, the current flowing in the battery rack 110 may be blocked.

On the contrary, when the relay controller 150 does not receive the current exceeding signal by the current comparing unit 130, the relay controller 150 may not control the operation states of the precharge relay 141 and the main relay 143.

In the meantime, when the relay controller 150 receives a voltage imbalance signal by the voltage comparing unit, which will be described below, the relay controller 150 may serve to change the operation states of the precharge relay 141 and the main relay 143 from the on state to the off state. The aforementioned functions of the relay controller 150, the voltage measuring unit 160, and the voltage comparing unit 170 will be described in detail with reference to FIG. 4 below.

Figure 4:
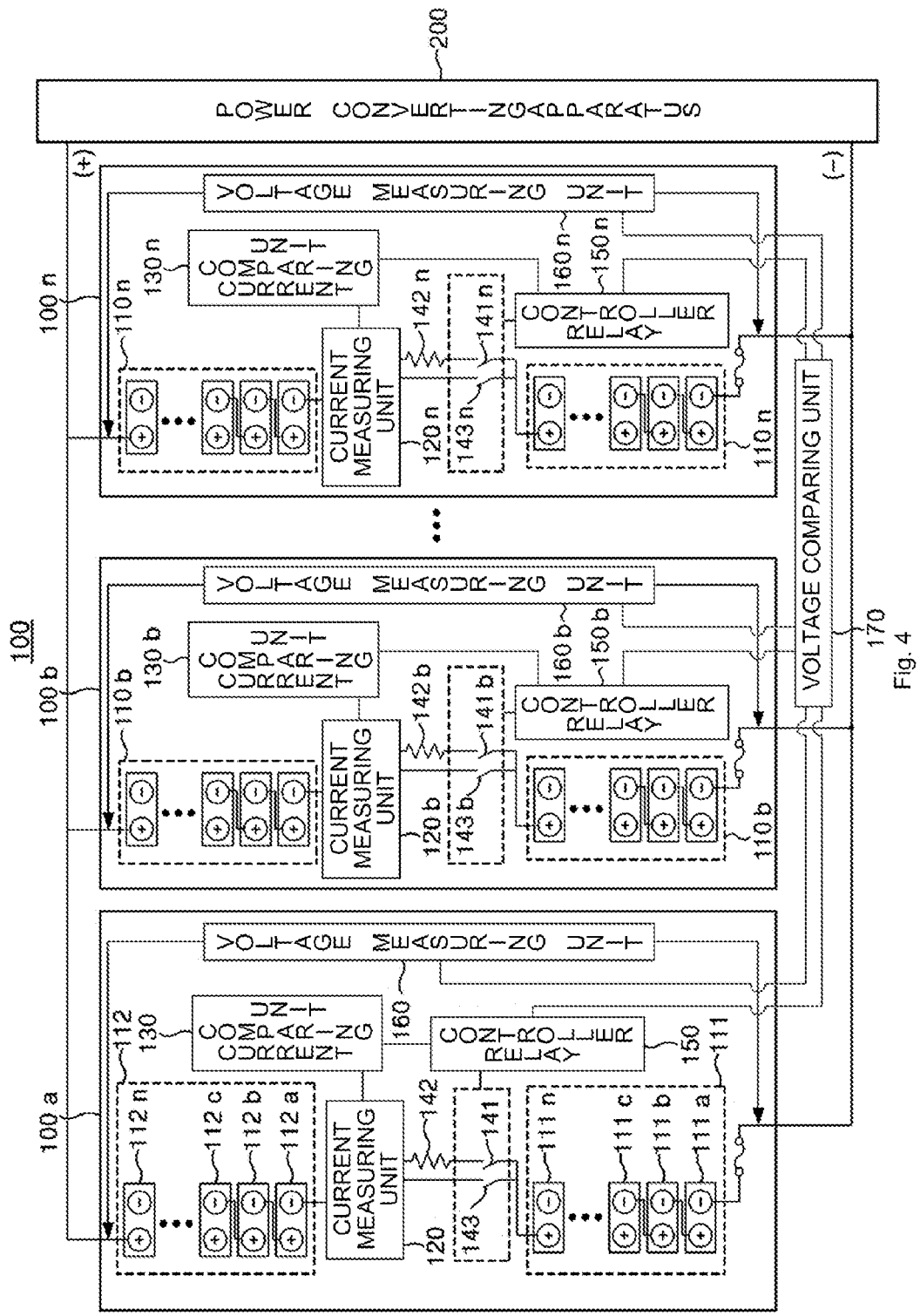
FIG. 4 is a diagram illustrating an example of a particular configuration of a system for preventing a battery rack from being damaged by measuring a current.

FIG. 4 is a diagram illustrating an example of a particular configuration of a system for preventing a battery rack from being damaged by measuring a current according to the exemplary embodiment of the present invention. FIG. 4 is a diagram illustrating one example of the case where a system 100 for preventing a battery rack from being damaged by measuring a current is operated, and when being compared with FIG. 3, the system 100 for preventing a battery rack from being damaged by measuring a current has the same configuration as that of the apparatus 100 for preventing a battery rack from being damaged by measuring a current, except that a plurality of apparatuses 100a, . . . , and 100n for preventing a battery rack from being damaged by measuring a current is connected with each other in parallel, and one voltage comparing unit 170 is connected with the voltage measuring units 160, 160b, . . . , and 160n, and relay controllers 150, 150b, . . . , and 150n of the plurality of apparatuses 100a, . . . , and 100n for preventing a battery rack from being damaged by measuring a current, respectively, and has also the same functions to those of the apparatus 100 for preventing a battery rack from being damaged by measuring a current, so that detailed descriptions of the same constituent elements will be omitted.

Referring to FIG. 4, in the system 100 for preventing a battery rack from being damaged by measuring a current according to the exemplary embodiment of the present invention, the apparatuses 100a, . . . , and 100n for preventing a battery rack from being damaged by measuring a current may be provided in one or more battery racks 111, 112, 110b, . . . , and 110n, respectively.

The system 100 for preventing a battery rack from being damaged by measuring a current may individually perform, on each of the first and second battery racks 111 and 112 provided with the apparatus 100a for preventing a battery rack from being damaged by measuring a current, a process of measuring and comparing a current value of a current flowing between the first and second battery racks 111 and 112 with a predetermined current limit value, and controlling operation states of a precharge relay 141 and a main relay 143 of the first and second battery racks 111 and 112 according to a result of the comparison.

Similar to the individual performance of the process on each of the first and second battery racks 111 and 112 provided with the apparatus 100a for preventing a battery rack from being damaged by measuring a current, the aforementioned process may be individually performed on the battery racks 110b, . . . , and 110n provided with the apparatuses 100b, . . . , and 100n for preventing a battery rack from being damaged by measuring a current, respectively.

Through each individual process of the apparatuses 100a, . . . , and 100n for preventing a battery rack from being damaged by measuring a current, it is possible to easily recognize only the battery rack in which a precharge relay, a precharge resistor, and a main relay are abnormally installed, in an energy storage device or a battery system in which one or more battery racks are connected to charge/discharge power, and it is possible to continuously charge/discharge the energy storage device or the battery system by individually blocking only the precharge relay and the main relay of the corresponding battery rack without blocking all of the current of the one or more battery racks which are connected with each other.

The voltage measuring units 160, 160b, . . . , and 160n may be positioned at both terminals (a plus (+) electrode and a minus (−) electrode) of the battery racks of the apparatuses 100a, 100b, . . . , and 100n for preventing a battery rack from being damaged by measuring a current, respectively, and serve to measure a potential difference in voltages applied to the battery racks 111, 112, 110b, . . . , and 110n. In the meantime, the voltage measuring units 160, 160b, . . . , and 160n may include one or more switch elements, capacitors, conductive lines, and the like in order to measure voltages of the battery racks 111, 112, 110b, . . . , and 110n. The voltage values measured by the voltage measuring units 160, 160b, . . . , and 160n may be transmitted to a voltage comparing unit 170 which will be described below.

The voltage comparing unit 170 may serve to receive a plurality of voltage values measured by the voltage measuring units 160, 160b, . . . , and 160n and calculate a difference between the voltage values, and compare and determine the calculated result values with a predetermined voltage allowance difference.

Here, the predetermined voltage allowance difference, which is a voltage difference between the battery racks, at which the battery rack is not damaged even though a voltage difference is generated between the battery racks, is a value settable by a user. For example, the predetermined voltage allowance difference may be 50 V.

Next, when a result value exceeding the predetermined voltage allowance difference is calculated among the result values obtained by calculating the difference between the measured voltage values, the voltage comparing unit 170 may transmit a voltage imbalance signal to the relay controllers 150, 150b, . . . , and 150n, and when a result value exceeding the predetermined voltage allowance difference is not calculated among the calculated result values, the voltage comparing unit 170 may not transmit the voltage imbalance signal to the relay controllers 150, 150b, . . . , and 150n.

The relay controllers 150, 150b, . . . , and 150n may be connected with the voltage comparing unit 170, precharge relays 141, 141b, . . . , and 141n, precharge resistors 142, 142b, . . . , and 142n, and main relays 143, 143b, . . . , and 143n, respectively, and when the relay controllers 150, 150b, . . . , and 150n receive the voltage imbalance signal by the voltage comparing unit 170, the relay controllers 150, 150b, . . . , and 150n may change operation states of the precharge relay and the main relay of the battery rack, in which the result value exceeding the predetermined voltage allowance difference is calculated, from an on state to an off state.

Other normal battery racks are blocked from the battery rack, in which capacitance imbalance occurs, by controlling the precharge relay and the main relay, thereby preventing capacitance imbalance between the battery racks.

On the contrary, when the relay controllers 150, 150b, . . . , and 150n receive the voltage imbalance signal by the voltage comparing unit 170, the relay controllers 150, 150b, . . . , and 150n may not control operation states of the precharge resistors 142, 142b, . . . , and 142n, and the main relays 143, 143b, . . . , and 143n.

Figure 5:
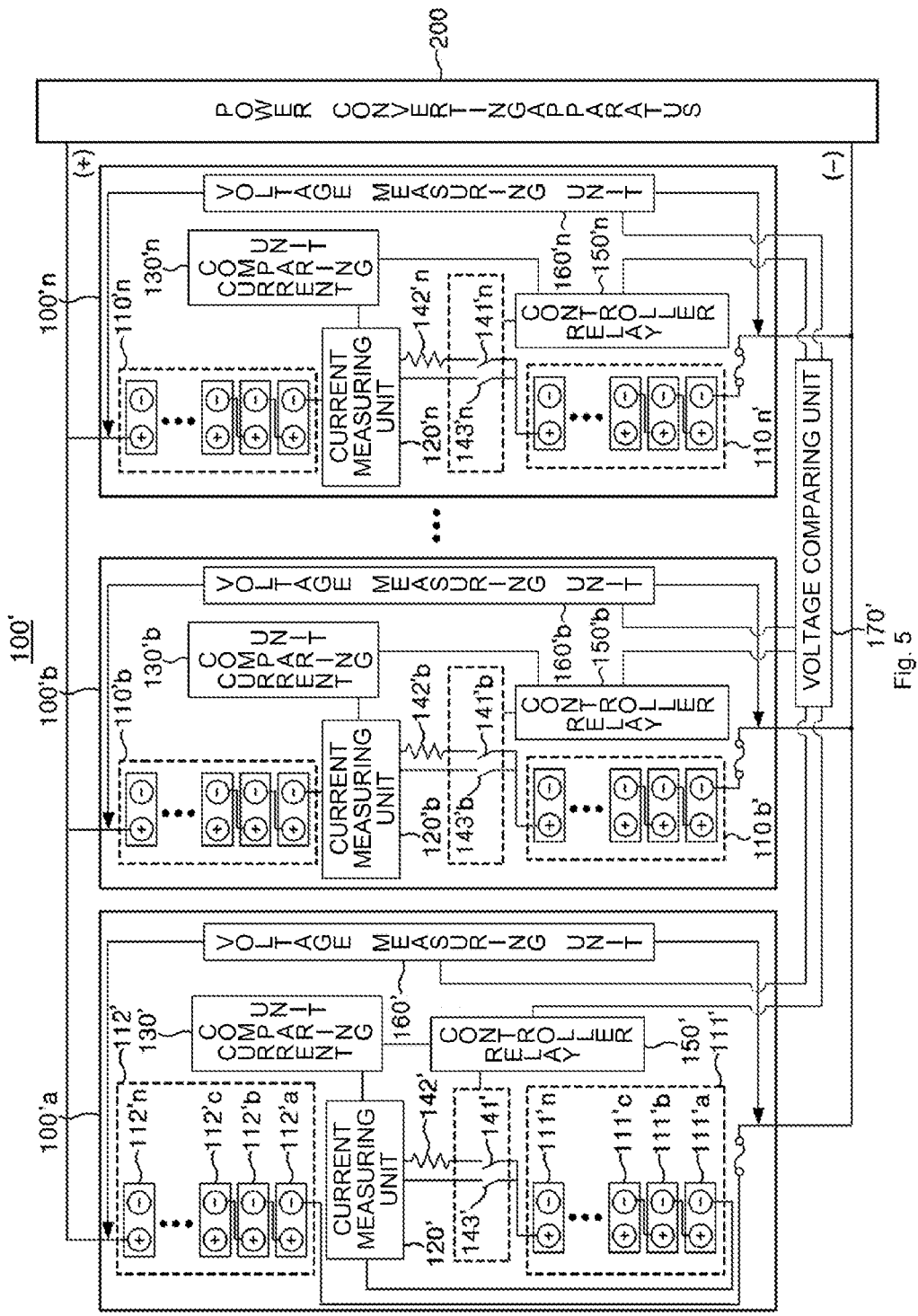
FIG. 5 is a diagram illustrating an example of the case where an apparatus for preventing a battery rack from being damaged by measuring a current is operated in a system for preventing a battery rack from being damaged by measuring a current.

FIG. 5 is a diagram illustrating an example of the case where an apparatus for preventing a battery rack from being damaged by measuring a current is operated in system for preventing a battery rack from being damaged by measuring a current.

In comparison between FIGS. 5 and 4, the precharge relays 141, 141b, . . . , and 141n, the precharge resistors 142, 142b, . . . , and 142n, and the main relays 143, 143b, . . . , and 143n do not configure closed circuits, and are normally connected in all of the battery racks 111, 112, 110b, . . . , and 110n illustrated in FIG. 4, respectively, but a precharge relay 141', a precharge resistor 142', and a main relay 143' are abnormally installed in a first battery rack 111' illustrated in FIG. 5 to form a closed circuit.

More particularly, referring to FIG. 5, an apparatus 100' for preventing a battery rack from being damaged by measuring a current, which is provided in a system 100' for preventing a battery rack from being damaged by measuring a current, may be an example in which the first battery rack 111' is abnormally connected with the precharge relay 141', the precharge resistor 142', and the main relay 143' to form a closed circuit without an external load. The precharge relay 141' and the precharge resistor 142' and the main relay 143' may be serially connected in the closed circuit and serve to prevent a short-circuit phenomenon when an operation state of the precharge relay 141' is changed from an off state to an on state, and descriptions of the same constituent elements as those of the system 100' for preventing a battery rack from being damaged by measuring a current, which is illustrated in FIG. 5, among the constituent elements described with reference to FIGS. 1 to 4, will be omitted.

When the apparatus 100'a for preventing a battery rack from being damaged by measuring a current receives power from a power converting apparatus 200, the power may be charged in a second battery rack 112', except for the first battery rack 111', and a current measuring unit 120' may serve to measure a current value of a current flowing in the first battery rack 111', except for the second battery rack 112'. The current value measured by the current measuring unit 120' is a value measured when only the precharge resistor 142' is connected to the second battery rack 112', so that the current value measured by the current measuring unit 120' may be greater than current values measured by other current measuring units 120'b, . . . , and 120'n.

When an operation state of the main relay 143' is changed from an off state to an on state, a short-circuit phenomenon may occur in the closed circuit. In order to prevent the short-circuit phenomenon, a current comparing unit 130' may serve to compare and determine a current value measured by the current measuring unit 120' with a predetermined current limit value, and transmit a current exceeding signal to a relay controller 150' when the measured current value exceeds the predetermined current limit value. The relay controller 150' receiving the current exceeding signal may serve to prevent the short-circuit phenomenon that occurs in the first battery rack 111', by maintaining an operation state of the precharge relay 141' in an off state before an operation state of the main relay 143' is changed from the off state to an on state.

Further, when the short-circuit phenomenon occurs in the first battery rack 111', the relay controller 150' may serve to prevent damage due to overcharging, overheating, or swelling that occurs by a variation of each charging speed by a capacitance deviation between the battery racks 100'a, . . . , and 100'n. Here, a current value obtained by measuring a current flowing between the first battery rack 110' and the second battery rack 112', in which the first battery rack 110' and the second battery rack 112' are normally connected with the precharge relay 141', the precharge resistor 142', and the main relay 143', so that a short circuit is not incurred, may be initially set as the predetermined current limit value, or the predetermined current limit value may be a value settable by a user. For example, the predetermined current limit value may be 50 A.

Figure 6:
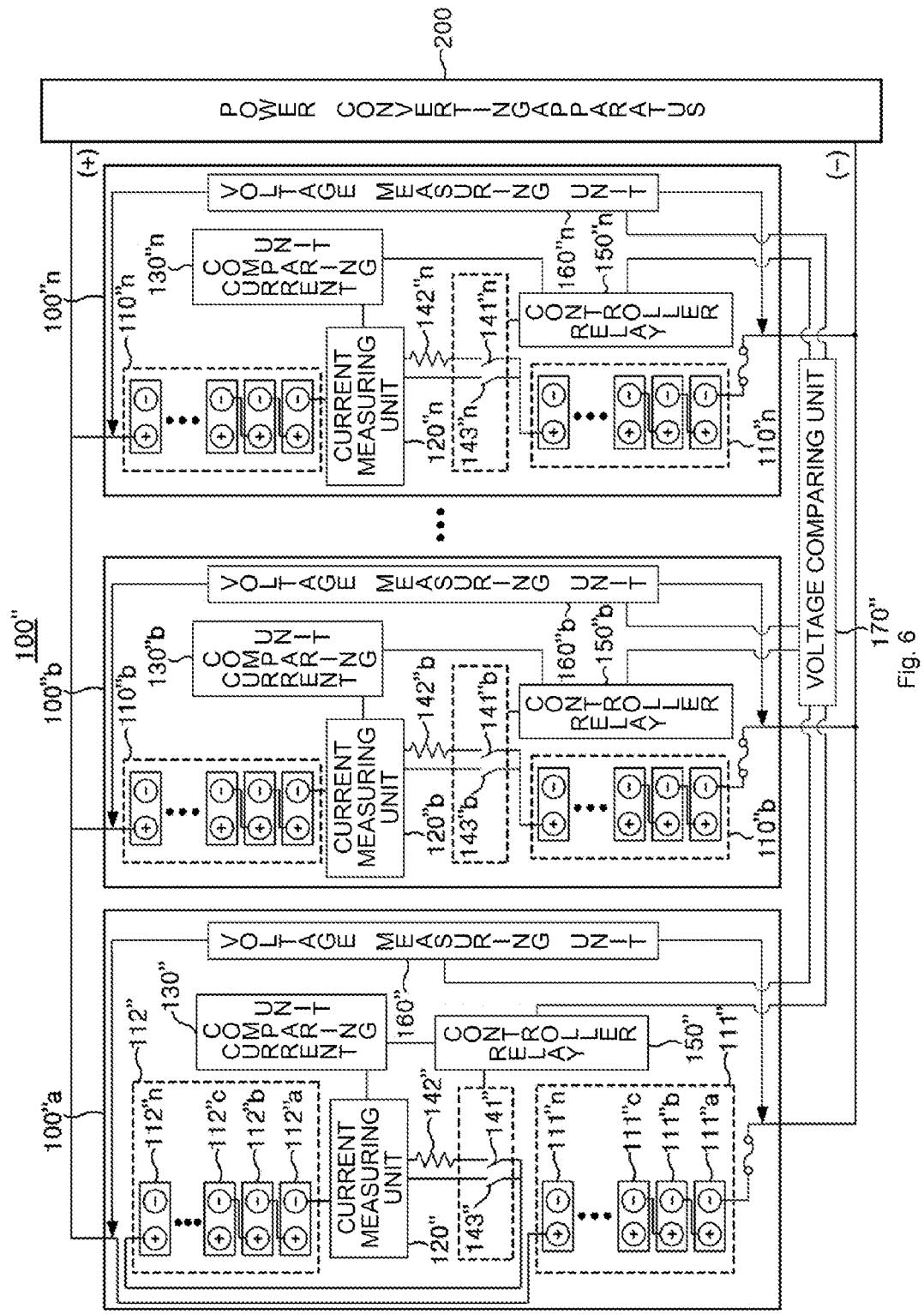
FIG. 6 is a diagram illustrating another example of the case where an apparatus for preventing a battery rack from being damaged by measuring a current is operated in a system for preventing a battery rack from being damaged by measuring a current.

FIG. 6 is a diagram illustrating another example of the case where an apparatus for preventing a battery rack from being damaged by measuring a current is operated in a system for preventing a battery rack from being damaged by measuring a current.

In comparison between FIGS. 6 and 4, the precharge relays 141, 141b, . . . , and 141n, the precharge resistors 142, 142b, . . . , and 142n, and the main relays 143, 143b, . . . , and 143n do not configure closed circuits, and are normally connected in all of the battery racks 111, 112, 110b, . . . , and 110n illustrated in FIG. 4, respectively, but a precharge relay 141", a precharge resistor 142", and a main relay 143" are abnormally installed in a second battery rack 111" illustrated in FIG. 6 to configure a closed circuit.

More particularly, referring to FIG. 6, an apparatus 100"a for preventing a battery rack from being damaged by measuring a current, which is provided in a system 100" for preventing a battery rack from being damaged by measuring a current, may be an example in which the first battery rack 112" is abnormally connected with a precharge relay 141", the precharge resistor 142", and the main relay 142" to form a closed circuit without an external load. The precharge relay 141" and the precharge resistor relay 142" may be serially connected in the closed circuit and serve to prevent a short-circuit phenomenon when an operation state of the precharge relay 141" is changed from an off state to an on state, and descriptions of the same constituent elements as those of the system 100" for preventing a battery rack from being damaged by measuring a current, which is illustrated in FIG. 6, among the constituent elements described with reference to FIGS. 1 to 4 will be omitted.

When the apparatus 100" for preventing a battery rack from being damaged by measuring a current receives power from a power converting apparatus 200, the power may be charged in the first battery rack 111", except for the second battery rack 112", and a current measuring unit 120" may serve to measure a current value of a current flowing in the second battery rack 112", except for the first battery rack 111". The current value measured by the current measuring unit 120" is a value measured when only the precharge resistor 142" is connected to the first battery rack 111", so that the current value measured by the current measuring unit 120" may be greater than current values measured by other current measuring units 120"b, . . . , and 120"n.

When an operation state of the main relay 143" is changed from an off state to an on state, a short-circuit phenomenon may occur in the closed circuit. In order to prevent the short-circuit phenomenon, a current comparing unit 130" may serve to compare a current value measured by the current measuring unit 120" with a predetermined current limit value, and transmit a current exceeding signal to a relay controller 150" when the measured current value exceeds the predetermined current limit value. The relay controller 150" receiving the current exceeding signal may serve to prevent the short-circuit phenomenon that occurs in the second battery rack 112", by changing an operation state of the precharge relay 141" from an on state to an off state and maintaining an operation state of the main relay 143" in an off state before an operation state of the main relay 143" is changed from the off state to the on state.

Further, when the short-circuit phenomenon occurs in the second battery rack 112", the relay controller 150" may serve to prevent damage due to overcharging, overheating, or swelling that occurs due to a variation of each charging speed caused by a capacitance deviation between the battery racks 100"a, . . . , and 100"n.

Here, a current value obtained by measuring a current flowing between the first battery rack 111" and the second battery rack 112", in which the first battery rack 111" and the second battery rack 112" are normally connected with the precharge relay 141", the precharge resistor 142", and the main relay 143", so that a short circuit is not incurred, may be initially set as the predetermined current limit value, or the predetermined current limit value may be a value settable by a user. For example, the predetermined current limit value may be 50 A.

Figure 7:
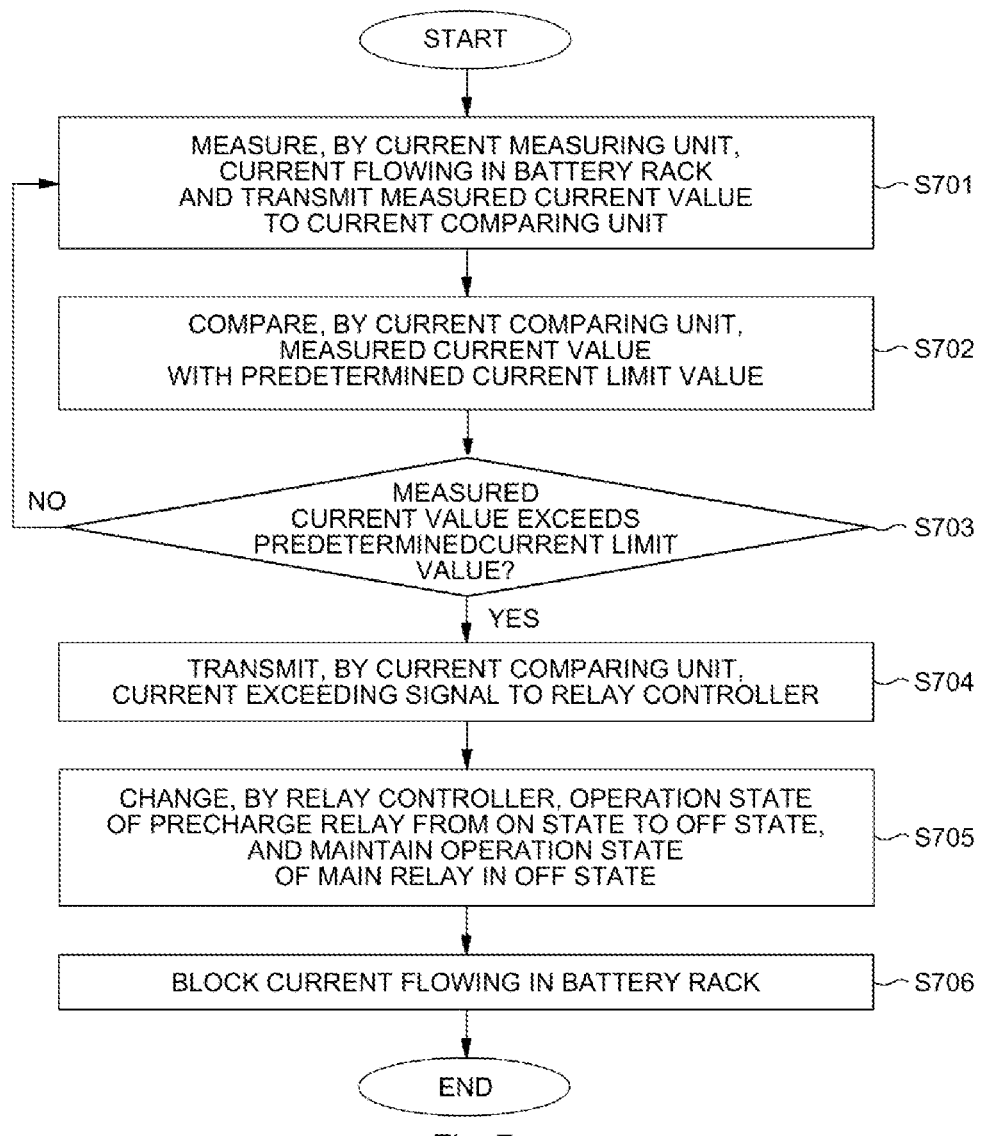
FIG. 7 is a flowchart sequentially illustrating an example of a method of preventing a battery rack from being damaged by measuring a current according to an exemplary embodiment of the present invention.

FIG. 7 is a flowchart sequentially illustrating an example of a method of preventing a battery rack from being damaged by measuring a current according to an exemplary embodiment of the present invention.

Referring to FIG. 7, first, the current measuring unit 120 measures a current value of a current flowing in the battery rack 110, and transmits the measured current value to the current comparing unit 130 (S701).

Next, the current comparing unit 130 compares and determines whether the measured current value received by the current measuring unit 120 exceeds a predetermined current limit value (S702).

Here, a current value measured in the battery rack 110, in which the battery rack 110 is normally connected with the precharge relay 141, the precharge resistor 142, and the main relay 143, which will be described below, so that a short circuit is not incurred, may be initially set as the predetermined current limit value, or the predetermined current limit value may be a value settable by a user. For example, the predetermined current limit value may be 50 A.

When a comparison result value determined by the current comparing unit 130 exceeds the predetermined current limit value (S703), the current comparing unit 130 transmits a current exceeding signal to the relay controller 150 (S704).

On the contrary, when the comparison result value determined by the current comparing unit 130 does not exceed the predetermined current limit value (S703), the process returns to the beginning.

The relay controller 150 receives the current exceeding signal and changes an operation state of the precharge relay 141 from an on state to an off state, and maintains an operation state of the main relay 143 in the off state before an operation state of the main relay 143 is changed from the off state to the on state (S705).

As a result, the operation states of the precharge relay 141 and the main relay 143 become the off state, thereby blocking the current flowing in the battery rack 110 (S706).

Figure 8:
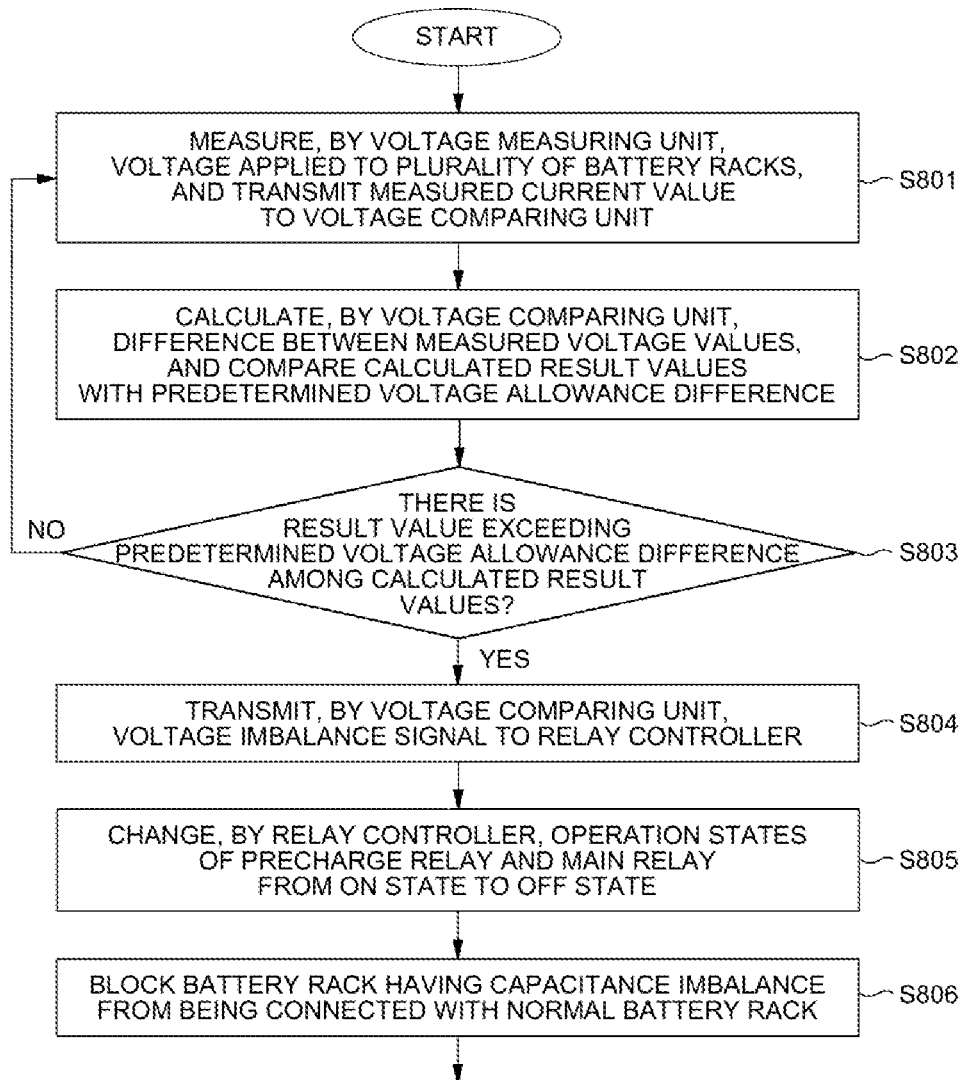
FIG. 8 is a flowchart illustrating another example of a method of preventing a battery rack from being damaged by measuring a current according to an exemplary embodiment of the present invention in a sequence.

FIG. 8 is a flowchart sequentially illustrating another example of a method of preventing a battery rack from being damaged by measuring a current according to an exemplary embodiment of the present invention.

Referring to FIG. 8, first, the voltage measuring units 160, 160*b*, . . . , and 160*n* measure voltages applied to the plurality of battery racks, respectively, and transmit the measured voltage values to the voltage comparing unit 170 (S801).

Next, the voltage comparing unit 170 calculates a difference between the measured voltage values received from the voltage measuring units 160, 160*b*, . . . , and 160*n*, and compares the calculated result values with a predetermined voltage allowance difference and determines whether there is the calculated result value exceeding the predetermined voltage allowance difference among the calculated result values (S802).

Here, the predetermined voltage allowance difference, which is a voltage difference between the battery racks, at which the battery rack is not damaged even though a voltage difference is generated between the battery racks, is a value settable by a user. For example, the predetermined voltage allowance difference may be 50 V.

When the voltage comparing unit 170 determines that there is the calculated result value exceeding the predetermined voltage allowance difference among the calculated result values (S803), the voltage comparing unit 170 transmits a voltage imbalance signal to the relay controller 150 (S804).

On the contrary, when the voltage comparing unit 170 determines that there is no calculated result value exceeding the predetermined voltage allowance difference among the calculated result values, the process returns to the beginning.

The relay controller 150 receives the voltage imbalance signal, and changes the operation states of the precharge relay and the main relay of the battery rack, in which capacitance imbalance occurs, from an on state to the off state (S805).

As a result, the operation states of the precharge relay and the main relay of the battery rack, in which capacitance imbalance occurs, become the off state, thereby blocking the battery rack, in which capacitance imbalance occurs, from being connected with a normal battery rack (S806).

The present invention has been described with reference to the exemplary embodiments, but those skilled in the art may understand that the present invention may be variously modified and changed within the scope without departing from the spirit and the area of the present invention described in the accompanying claims.

The invention claimed is:

1. An apparatus for preventing a battery rack from being damaged by measuring a current, comprising:
    a current measuring unit configured to measure a current value of a battery rack including a plurality of battery modules;
    a current comparing unit configured to compare whether the current value measured by the current measuring unit is greater or smaller than a predetermined current limit value;
    a relay controller configured to control operation states of a precharge relay and a main relay based on the comparison result value obtained by the current comparing unit before the operation state of the main relay is changed from an off state to an on state after the operation state of the precharge relay is changed to the on state; and
    a voltage measuring unit configured to measure a voltage value of the battery rack,
    wherein the apparatus for preventing a battery rack from being damaged by measuring a current is provided in one or more battery racks each, and individually performs, on a corresponding battery rack, a process of measuring a current value of the corresponding battery rack, comparing the measured current value with a predetermined current limit value, and controlling operation states of a precharge relay and a main relay of the corresponding battery rack according to a result of the comparison, and a process of measuring a voltage value of the corresponding battery rack.

2. The apparatus of claim 1, wherein the precharge relay is serially connected with a precharge resistor, of which a resistance value is determined according to a capacity of the battery rack, to decrease a current value of an overcurrent flowing in the battery rack.

3. The apparatus of claim 1, wherein the current measuring unit measures a current value of a current flowing in the battery rack and transmits the measured current value to the current comparing unit, and includes a current sensor corresponding to one or more of a current transformer method, a hall element method, and a fuse method.

4. The apparatus of claim 1, wherein when the current value received from the current measuring unit exceeds the predetermined current limit value, the current comparing unit transmits a current exceeding signal to the relay controller.

5. The apparatus of claim 4, wherein when the relay controller receives the current exceeding signal from the current comparing unit, the relay controller changes the operation state of the precharge relay from the on state to the off state, and maintains the operation state of the main relay in the off state.

6. The apparatus of claim 1, further comprising:
a voltage comparing unit connected with the voltage measuring unit, which measures a voltage of a plurality of battery racks each, and configured to calculate a difference between the plurality of voltage values measured by the voltage measuring unit.

7. The apparatus of claim 6, wherein when the result value exceeding a predetermined voltage allowance difference is calculated among the result values obtained by calculating the difference between the plurality of voltage values, the voltage comparing unit transmits a voltage imbalance signal to a relay controller of a corresponding battery rack.

8. The apparatus of claim 7, wherein when the relay controller receives the voltage imbalance signal from the voltage comparing unit, the relay controller changes the operation states of the precharge relay and the main relay from the on state to the off state.

9. The apparatus of claim 1, wherein the apparatus is included in a battery management system (BMS) for controlling the one or more battery racks.

10. A system for preventing a battery rack from being damaged by measuring a current, comprising: an apparatus for preventing a battery rack from being damaged by measuring a current in one or more battery racks each, the apparatus for preventing a battery rack from being damaged by measuring a current, comprising:
a current measuring unit configured to measure a current value of a battery rack including a plurality of battery modules;
a current comparing unit configured to compare whether the current value measured by the current measuring unit is greater or smaller than a predetermined current limit value;
a relay controller configured to control operation states of a precharge relay and a main relay based on the comparison result value obtained by the current comparing unit before the operation state of the main relay is changed from an off state to an on state after the operation state of the precharge relay is changed to the on state; and
a voltage measuring unit configured to measure a voltage value of the battery rack,
wherein the system for preventing a battery rack from being damaged by measuring a current individually performs, on a corresponding battery rack, a process of measuring a current value of the corresponding battery rack, comparing the measured current value with a predetermined current limit value, and controlling operation states of a precharge relay and a main relay of the corresponding battery rack according to a result of the comparison, and a process of measuring a voltage value of the corresponding battery rack.

11. The system of claim 10, wherein the precharge relay is serially connected with a precharge resistor, of which a resistance value is determined according to a capacity of the battery rack, to decrease a current value of an overcurrent flowing in the battery rack.

12. The system of claim 10, wherein the current measuring unit measures a current value of a current flowing in the battery rack and transmits the measured current value to the current comparing unit, and includes a current sensor corresponding to one or more of a current transformer method, a hall element method, and a fuse method.

13. The system of claim 10, wherein when the current value received from the current measuring unit exceeds the predetermined current limit value, the current comparing unit transmits a current exceeding signal to the relay controller.

14. The system of claim 13, wherein when the relay controller receives the current exceeding signal from the current comparing unit, the relay controller changes the operation state of the precharge relay from the on state to the off state, and maintains the operation state of the main relay in the off state.

15. The system of claim 10, further comprising:
a voltage comparing unit connected with the voltage measuring unit, which measures a voltage of a plurality of battery racks each, and configured to calculate a difference between the plurality of voltage values measured by the voltage measuring unit.

16. The system of claim 15, wherein when the result value exceeding a predetermined voltage allowance difference is calculated among the result values obtained by calculating the difference between the plurality of voltage values, the voltage comparing unit transmits a voltage imbalance signal to a relay controller of a corresponding battery rack.

17. The system of claim 16, wherein when the relay controller receives the voltage imbalance signal from the voltage comparing unit, the relay controller changes the operation states of the precharge relay and the main relay from the on state to the off state.

18. The system of claim 1, wherein the system is included in a battery management system for controlling the one or more battery racks.

19. A method of preventing a battery rack from being damaged by measuring a current, comprising:
(a) providing an apparatus for preventing a battery rack from being damaged by measuring a current, which includes a current measuring unit, a current comparing unit, a relay controller, and a voltage measuring unit, in one or more battery racks each;
(b) individually performing, by the apparatus, on a corresponding battery rack, a process of measuring a current value of the corresponding battery rack, comparing the measured current value with a predetermined current limit value, and controlling operation states of a precharge relay and a main relay of the corresponding battery rack according to a result of the comparison, and a process of measuring a voltage value of the corresponding battery rack;
(c) providing a voltage comparing unit connected with the voltage measuring unit for measuring a voltage of the plurality of battery racks each; and
(d) receiving a voltage value of the plurality of battery racks, calculating a difference between the plurality of voltage values, and controlling operation states of a precharge relay and a main relay of a corresponding battery rack according to a result of the calculation,
wherein (b) includes:
(b1) measuring, by the current measuring unit, a current value of a battery rack including a plurality of battery modules;
(b2) comparing, by the current comparing unit, whether the current value measured by the current measuring unit is greater or smaller than a predetermined current limit value;
(b3) controlling, by the relay controller, the operation states of the precharge relay and the main relay based on the comparison result value obtained by the current comparing unit before the operation state of the main relay is changed from an off state to an on state after the operation state of the precharge relay is changed to the on state; and (b4) measuring, by the voltage measuring unit, a voltage value of the battery rack.

20. The method of claim 19, wherein (b1) includes measuring, by the current measuring unit, a current value of a current flowing in the battery rack, and transmitting the measured current value to the current comparing unit.

21. The method of claim 19, wherein (b2) includes, when the current value received from the current measuring unit exceeds the predetermined current limit value, transmitting, by the current comparing unit, a current exceeding signal to the relay controller.

22. The method of claim 19, wherein (b3) includes, when the relay controller receives the current exceeding signal from the current comparing unit, changing, by the relay controller, the operation state of the precharge relay from the on state to the off state, and maintaining the operation state of the main relay in the off state.

23. The method of claim 19, wherein (d) includes calculating, by the voltage comparing unit, a difference between a plurality of voltage values measured by the voltage measuring unit, and transmitting a voltage imbalance signal to the relay controller when the result value exceeding a predetermined voltage allowance difference is calculated among the calculated result values.

24. The method of claim 23, wherein (d) further includes changing, by the relay controller, the operation states of the precharge relay and the main relay from the on state to the off state when the relay controller receives the voltage imbalance signal from the voltage comparing unit.

\* \* \* \* \*